United States Patent
Ishii et al.

(10) Patent No.: US 7,923,644 B2
(45) Date of Patent: Apr. 12, 2011

(54) PRINTED CIRCUIT BOARD AND METHOD OF MANUFACTURING THE SAME

(75) Inventors: Jun Ishii, Ibaraki (JP); Toshiki Naitou, Ibaraki (JP); Mitsuru Honjo, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 12/611,261

(22) Filed: Nov. 3, 2009

(65) Prior Publication Data

US 2010/0116540 A1  May 13, 2010

Related U.S. Application Data

(60) Provisional application No. 61/119,387, filed on Dec. 3, 2008.

(30) Foreign Application Priority Data

Nov. 10, 2008 (JP) ................................. 2008-287772

(51) Int. Cl.
*H05K 1/00* (2006.01)

(52) U.S. Cl. ...................... 174/254; 174/260; 360/245.9; 29/846

(58) Field of Classification Search .................. 174/254, 174/260, 261, 262
See application file for complete search history.

(56) References Cited

U.S. PATENT DOCUMENTS

| | | | |
|---|---|---|---|
| 5,608,591 A | 3/1997 | Klaassen | |
| 5,754,369 A | 5/1998 | Balakrishnan | |
| 5,858,518 A | 1/1999 | Omote et al. | |
| 6,096,482 A | 8/2000 | Omote et al. | |
| 6,100,582 A | 8/2000 | Omote et al. | |
| 6,351,351 B1 | 2/2002 | Takasugi | |
| 6,392,148 B1* | 5/2002 | Ueno et al. | 174/72 A |
| 6,424,499 B1* | 7/2002 | Balakrishnan et al. | 360/245.9 |
| 6,894,874 B2* | 5/2005 | Maruyama et al. | 360/245.9 |
| 2001/0016975 A1 | 8/2001 | Amemiya et al. | |
| 2002/0100609 A1 | 8/2002 | Ookawa et al. | |
| 2004/0012889 A1 | 1/2004 | Hernandez | |
| 2004/0070884 A1 | 4/2004 | Someya et al. | |
| 2004/0264056 A1 | 12/2004 | Jang et al. | |
| 2005/0280944 A1 | 12/2005 | Yang et al. | |
| 2007/0253176 A1 | 11/2007 | Ishii et al. | |
| 2007/0295534 A1 | 12/2007 | Ishii et al. | |
| 2009/0183907 A1 | 7/2009 | Ishii et al. | |

FOREIGN PATENT DOCUMENTS

| | | |
|---|---|---|
| EP | 0834868 A1 | 4/1998 |
| GB | 2269941 A | 2/1994 |
| JP | 10-012983 A | 1/1998 |
| JP | 10507028 T | 7/1998 |
| JP | 2000-231709 A | 8/2000 |

(Continued)

*Primary Examiner* — Ishwarbhai B Patel
(74) *Attorney, Agent, or Firm* — Panitch Schwarze Belisario & Nadel LLP

(57) ABSTRACT

A printed circuit board and method of manufacturing the printed circuit board, including a first and a second write wiring patterns, an end of a first line and an end of a second line of the first write wiring pattern are arranged on both sides of a third line of the second write wiring pattern. Circular connection portions are provided at the ends of the first line and the second line. In addition, through holes are formed in respective portions of a base insulating layer below the connection portions. Each connection portion comes in contact with a connecting region of a suspension body within the through hole.

6 Claims, 14 Drawing Sheets

FOREIGN PATENT DOCUMENTS

| | | |
|---|---|---|
| JP | 2002222578 A | 8/2002 |
| JP | 2002289992 A | 10/2002 |
| JP | 2004-133988 A | 4/2004 |
| JP | 2006004599 A | 1/2006 |
| JP | 2006352347 A | 12/2006 |
| JP | 2007299982 A | 11/2007 |
| JP | 2008004756 A | 1/2008 |
| JP | 2008-257857 A | 10/2008 |

* cited by examiner

F I G. 4
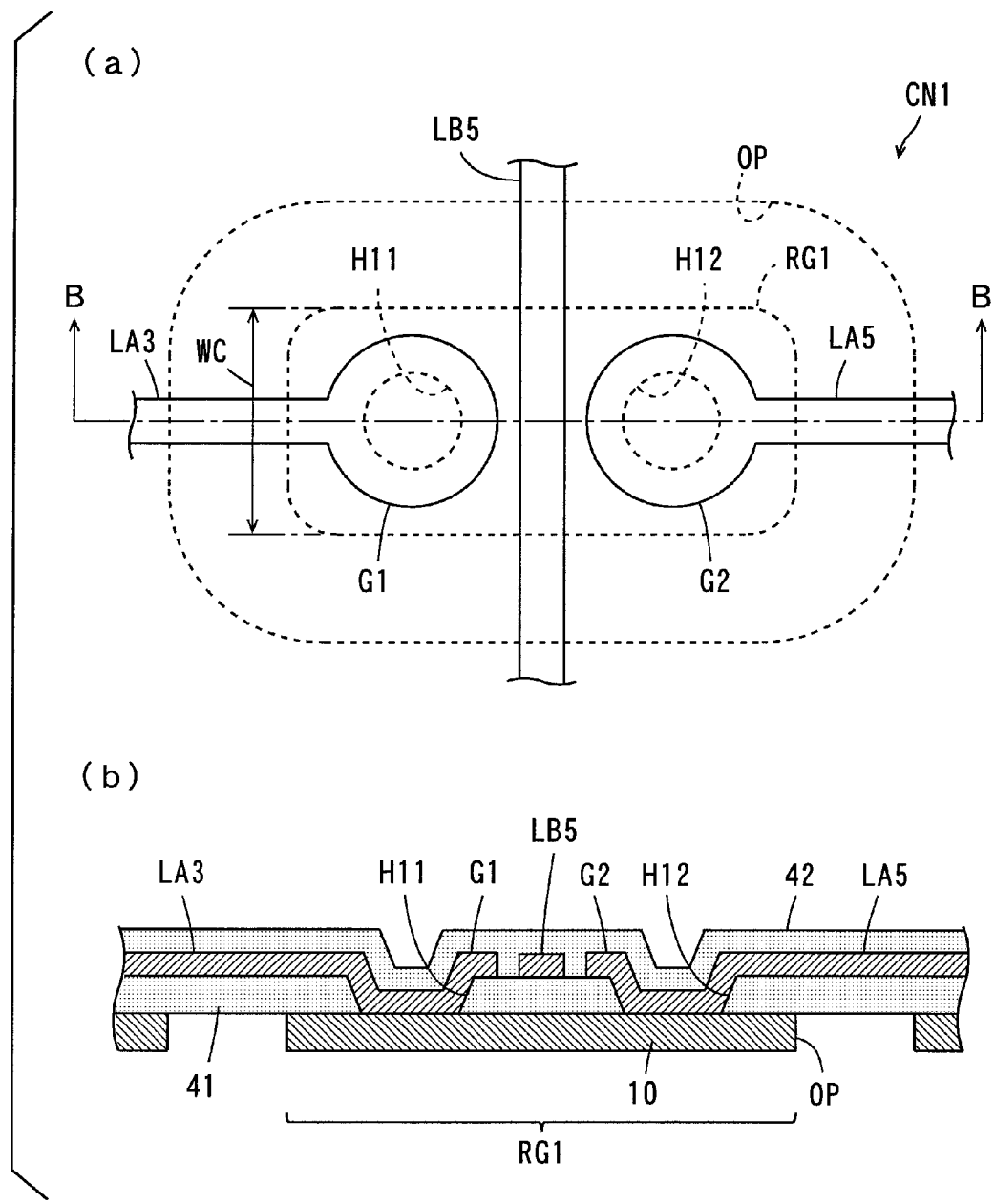

F I G. 5
(a)
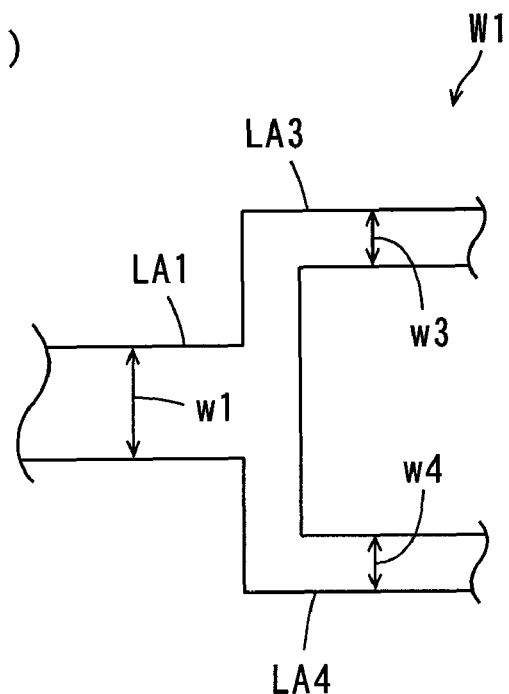
(b)
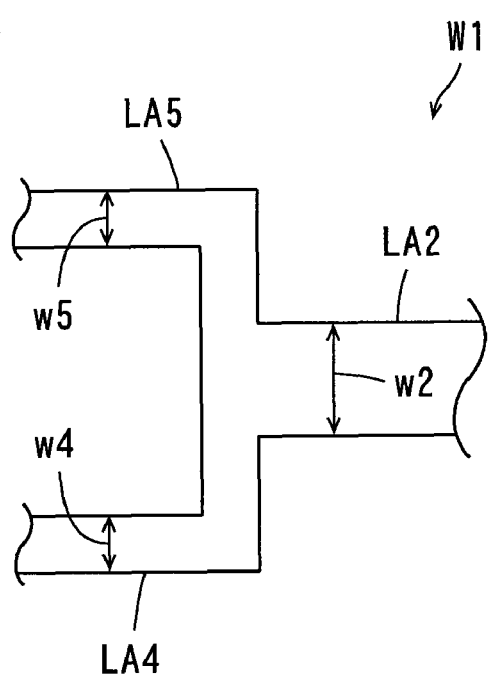

F I G. 6
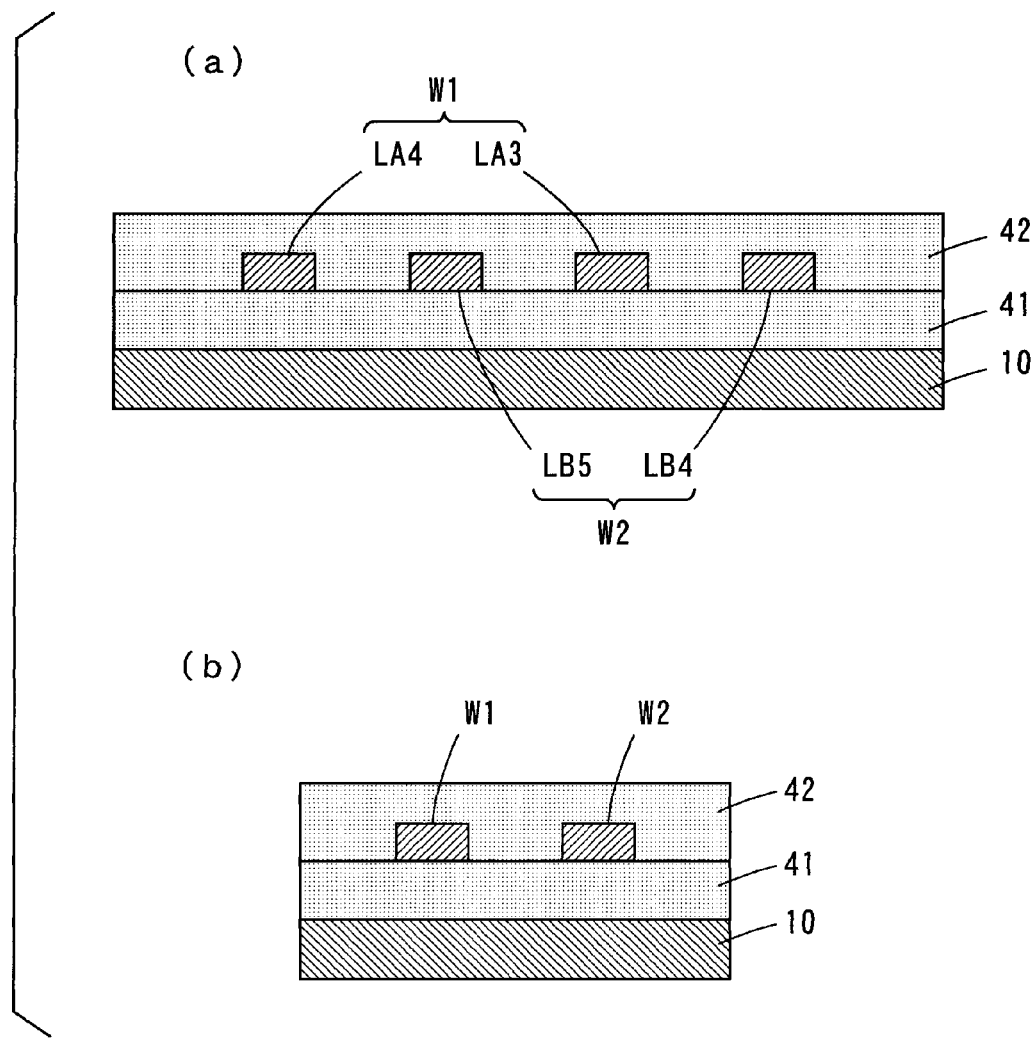

(a) TRANSMISSION REGION

INTERSECTION REGION (b) TRANSMISSION REGION

INTERSECTION REGION (c) TRANSMISSION REGION

INTERSECTION REGION

F I G. 9
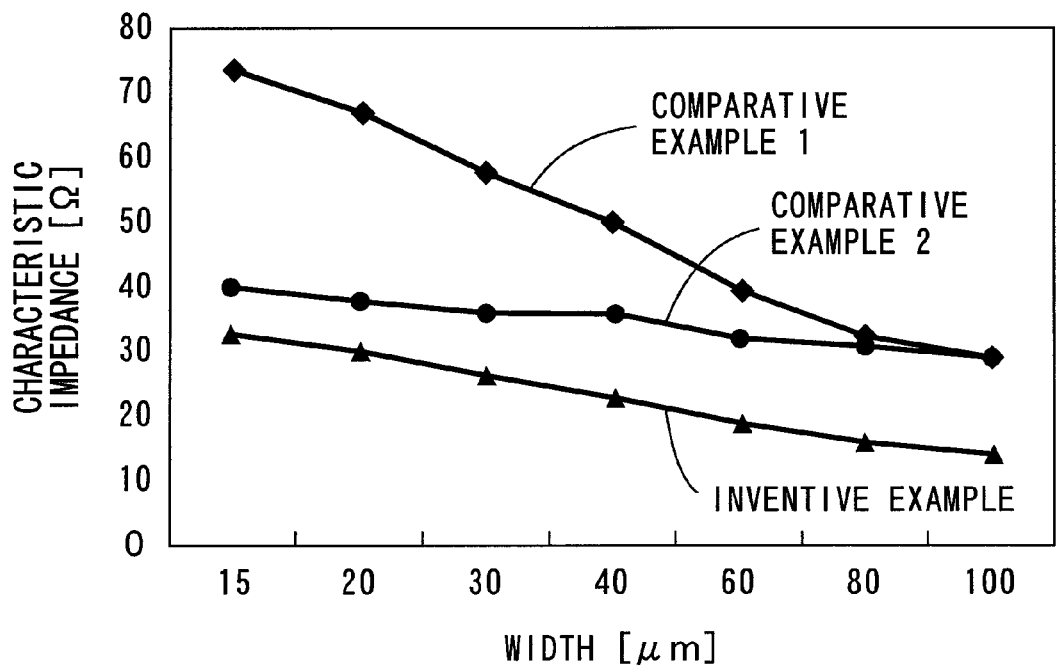

(a) TRANSMISSION REGION

INTERSECTION REGION (b) TRANSMISSION REGION

INTERSECTION REGION (c) TRANSMISSION REGION

INTERSECTION REGION

PRINTED CIRCUIT BOARD AND METHOD OF MANUFACTURING THE SAME

BACKGROUND OF THE INVENTION

1. Field of the Invention

The present invention relates to a printed circuit board and a method of manufacturing the same.

2. Description of the Background Art

Actuators are used in drives such as hard disk drives. Such an actuator includes an arm arranged rotatably with respect to a rotation shaft and a suspension board used for a magnetic head that is attached to the arm. The suspension board is a printed circuit board for aligning the magnetic head with a desired track of a magnetic disk. FIG. 15 is a vertical sectional view of a conventional suspension board (see JP 2004-133988 A, for example).

In the suspension board 910, a first insulating layer 904 is formed on a metal substrate 902. A write wiring trace W12 and a read wiring trace R12 are formed to be spaced apart from each other by a distance L1 on the first insulating layer 904.

A second insulating layer 905 is formed on the first insulating layer 904 to cover the write wiring trace W12 and the read wiring trace R12. On the second insulating layer 905, a write wiring trace W11 is formed at a position above the read wiring trace R12, and a read wiring trace R11 is formed at a position above the write wiring trace W12.

Each of the distance between the read wiring trace R11 and the write wiring trace W12 positioned one above the other and the distance between the read wiring trace R12 and the write wiring trace W11 positioned one above the other is L2.

In the suspension board 910 having the foregoing configuration, the distance between the write wiring trace W11 and the read wiring trace R11 and the distance between the write wiring trace W12 and the read wiring trace R11 are substantially equal to the distance between the write wiring trace W11 and the read wiring trace R12 and the distance between the write wiring trace W12 and the read wiring trace R12, respectively. Accordingly, it is considered that the magnitude of induced electromotive forces generated in the read wiring traces R11, R12 are substantially equal when the write current flows through the write wiring traces W11, W12. This allows crosstalk between the write wiring traces W11, W12 and the read wiring traces R11, R12 to be reduced.

Recently, recording densities of magnetic disks have been improved and a PMR (Perpendicular Magnetic Recording) system has been introduced, resulting in a growing need for larger currents for writing. Thus, impedances of wiring traces of magnetic heads and suspension boards need to be reduced.

SUMMARY OF THE INVENTION

An object of the present invention is to provide a printed circuit board with reduced characteristic impedances of wiring patterns and a method of manufacturing the same.

(1) According to an aspect of the present invention, a printed circuit board includes an insulating layer, first and second wiring patterns that are formed on one surface of the insulating layer and constitute a signal line pair, and a first connecting layer that is provided on the other surface of the insulating layer, wherein the first wiring pattern has first and second lines, the second wiring pattern has third and fourth lines, one ends of the first and second lines are electrically connected to each other and the other ends of the first and second lines are electrically connected to each other, one ends of the third and fourth lines are electrically connected to each other and the other ends of the third and fourth lines are electrically connected to each other, the first and second lines of the first wiring pattern and the third and fourth lines of the second wiring pattern are arranged such that any one of the first and second lines is located between the third and fourth lines and any one of the third and fourth lines is located between the first and second lines, a first intersection region in which the first or second line of the first wiring pattern and the third or fourth line of the second wiring pattern intersect with each other is provided, a second intersection region in which the first or second line of the first wiring pattern and the third or fourth line of the second wiring pattern intersect with each other is provided, a portion of the first or second line of the first wiring pattern positioned in the first intersection region is divided, a portion of the third or fourth line of the second wiring pattern positioned in the first intersection region is arranged on the insulating layer to pass through a portion in between divided portions of the first or second line of the first wiring pattern, the insulating layer has first and second through holes in the first intersection region, one of the divided portions of the first or second line of the first wiring pattern is electrically connected to the first connecting layer through the first through hole, and the other of the divided portions of the first or second line of the first wiring pattern is electrically connected to the first connecting layer through the second through hole.

In the printed circuit board, the first and second lines of the first wiring pattern and the third and fourth lines of the second wiring pattern are arranged such that any one of the first and second lines is located between the third and fourth lines and any one of the third and fourth lines is located between the first and second lines. In this case, three side surfaces out of one side surface and the other side surface of the first line and one side surface and the other side surface of the second line are opposite to three side surfaces out of one side surface and the other side surface of the third line and one side surface and the other side surface of the fourth line, respectively. This increases an area in which the first wiring pattern and the second wiring pattern are opposite to each other, thus increasing capacitances of the first and second wiring patterns. This results in reduced characteristic impedances of the first and second wiring patterns.

The portion of the first or second line of the first wiring pattern is divided, and the portion of the third or fourth line of the second wiring pattern is arranged to pass through the portion in between the divided portions of the first or second line of the first wiring pattern in the first intersection region.

One of the divided portions of the first or second line of the first wiring pattern is electrically connected to the first connecting layer through the first through hole of the insulating layer, and the other is electrically connected to the first connecting layer through the second through hole of the insulating layer. In this case, the divided portions of the first or second line of the first wiring pattern are electrically connected to each other through the first connecting layer.

This allows electrical connection of the first wiring pattern to be ensured and the first and second lines of the first wiring pattern and the third and fourth lines of the second wiring pattern to be arranged such that any one of the first and second lines is located between the third and fourth lines and any one of the third and fourth lines is located between the first and second lines with a simple configuration. Accordingly, the characteristic impedances of the first and second wiring patterns can be easily reduced at low cost.

(2) The printed circuit board may further include a metal layer formed on the other surface of the insulating layer, wherein the first connecting layer may be composed of part of the metal layer and may be electrically separated from other portions of the metal layer.

In this case, the first and second wiring patterns are opposite to the metal layer with the insulating layer sandwiched therebetween, thus further increasing the capacitances of the first and second wiring patterns. This further reduces the characteristic impedances of the first and second wiring patterns.

Moreover, the first connecting layer is composed of the part of the metal layer, thereby allowing the first connecting layer and the metal layer to be formed in a common manufacturing step. This prevents a complicated manufacturing step, improving productivity.

(3) The printed circuit board may further include a second connecting layer provided on the other surface of the insulating layer, wherein a portion of the third or fourth line of the second wiring pattern positioned in the second intersection region may be divided, a portion of the first or second line of the first wiring pattern positioned in the second intersection region may be arranged on the insulating layer to pass through a portion in between divided portions of the third or fourth line of the second wiring pattern, the insulating layer may have third and fourth through holes in the second intersection region, one of the divided portions of the third or fourth line of the second wiring pattern may be electrically connected to the second connecting layer through the third through hole, and the other of the divided portions of the third or fourth line of the second wiring pattern may be electrically connected to the second connecting layer through the fourth through hole.

In this case, the portion of the third or fourth line of the second wiring pattern is divided, and the portion of the first or second line of the first wiring pattern is arranged to pass through the portion in between the divided portions of the third or fourth line of the second wiring pattern in the second intersection region.

One of the divided portions of the third or fourth line of the second wiring pattern is electrically connected to the second connecting layer through the third through hole of the insulating layer, and the other is electrically connected to the second connecting layer through the fourth through hole of the insulating layer. In this case, the divided portions of the third or fourth line of the second wiring pattern are electrically connected to each other through the second connecting layer.

Accordingly, the divided portions of the first or second line of the first wiring pattern are connected to each other and the divided portions of the third or fourth line of the second wiring pattern are connected to each other with the same configuration in the first and second intersection regions. Thus, a balance between the first wiring pattern and the second wiring pattern is ensured. This results in good transmission characteristics in the first wiring pattern and the second wiring pattern.

(4) The printed circuit board may further include a metal layer formed on the other surface of the insulating layer, wherein the first connecting layer may be composed of part of the metal layer and electrically separated from other portions of the metal layer, and the second connecting layer may be composed of another part of the metal layer and electrically separated from other portions of the metal layer.

In this case, the first and second wiring patterns are opposite to the metal layer with the insulating layer sandwiched therebetween, thus further increasing the capacitances of the first and second wiring patterns. This further reduces the characteristic impedances of the first and second wiring patterns.

Moreover, the first and second connecting layers are made of the parts of the metal layer, thereby allowing the first and second connecting layers and the metal layer to be formed in a common manufacturing step. This prevents a complicated manufacturing step, improving productivity.

(5) The printed circuit board may further include a fifth line branched from the one end of the first line or the one end of the second line, a sixth line branched from the other end of the first line or the other end of the second line, a seventh line branched from the one end of the third line or the one end of the fourth line, and an eighth line branched from the other end of the third line or the other end of the fourth line, wherein a width of each of the fifth line and the sixth line may be obtained by adding a width of the first line and a width of the second line, and a width of each of the seventh line and the eighth line may be obtained by adding a width of the third line and a width of the fourth line.

In this case, the integrated characteristic impedances of the first and second lines are equal to the characteristic impedance of each of the fifth and sixth lines in the first wiring pattern. Similarly, the integrated characteristic impedances of the third and fourth lines are equal to the characteristic impedance of each of the seventh and eighth lines in the second wiring pattern. This reduces transmission loss in the first and second wiring patterns.

(6) According to another aspect of the present invention, a method of manufacturing a printed circuit board includes the steps of forming first and second wiring patterns constituting a signal line pair on one surface of an insulating layer, and forming a connecting layer on the other surface of the insulating layer, wherein the step of forming the first and second wiring patterns includes the steps of forming first and second through holes in the insulating layer in a first intersection region, and forming the first and second wiring patterns on the insulating layer such that the first wiring pattern is composed of first and second lines and the second wiring pattern is composed of the third and fourth lines, the first and second lines of the first wiring pattern and the third and fourth lines of the second wiring pattern are arranged such that any one of the first and second lines is located between the third and fourth lines and any one of the third and fourth lines is located between the first and second lines, the first or second line of the first wiring pattern and the third or fourth line of the second wiring pattern intersect with each other in the first intersection region and the first or second line of the first wiring pattern and the third or fourth line of the second wiring pattern intersect with each other in a second intersection region, one ends of the first and second lines are electrically connected to each other, the other ends of the first and second lines are electrically connected to each other, one ends of the third and fourth lines are electrically connected to each other, the other ends of the third and fourth lines are electrically connected to each other, a portion of the first or second line of the first wiring pattern positioned in the first intersection region is divided, a portion of the third or fourth line of the second wiring pattern positioned in the first intersection region passes through a portion in between divided portions of the first or second line of the first wiring pattern on the insulating layer, one of the divided portions of the first or second line of the first wiring pattern is electrically connected to the connecting layer through the first through hole, and the other of the divided portions of the first or second line of the first wiring pattern is electrically connected to the connecting layer through the second through hole.

In the manufacturing method, the first and second lines of the first wiring pattern and the third and fourth lines of the second wiring pattern are arranged such that any one of the first and second lines is located between the third and fourth lines and any one of the third and fourth lines is located between the first and second lines. In this case, three side surfaces out of one side surface and the other side surface of the first line and one side surface and the other side surface of the second line are opposite to three side surfaces out of one side surface and the other side surface of the third line and one side surface and the other side surface of the fourth line, respectively. This increases an area in which the first wiring pattern and the second wiring pattern are opposite to each other, thus increasing capacitances of the first and second wiring patterns. This results in reduced characteristic impedances of the first and second wiring patterns.

The portion of the first or second line of the first wiring pattern is divided, and the portion of the third or fourth line of the second wiring pattern is arranged to pass through the portion in between the divided portions of the first or second line of the first wiring pattern in the first intersection region.

One of the divided portions of the first or second line of the first wiring pattern is electrically connected to the connecting layer through the first through hole of the insulating layer, and the other is electrically connected to the connecting layer through the second through hole of the insulating layer. In this case, the divided portions of the first or second line of the first wiring pattern are electrically connected to each other through the connecting layer.

This allows electrical connection of the first wiring pattern to be ensured and the first and second lines of the first wiring pattern and the third and fourth lines of the second wiring pattern to be arranged such that any one of the first and second lines is located between the third and fourth lines and any one of the third and fourth lines is located between the first and second lines with a simple configuration. Accordingly, the characteristic impedances of the first and second wiring patterns can be easily reduced at low cost.

According to the present invention, the area in which the first wiring pattern and the second wiring pattern are opposite to each other is increased, thus increasing the capacitances of the first and second wiring patterns. This results in reduced characteristic impedances of the first and second wiring patterns. In addition, electrical connection of the first wiring pattern can be ensured, and the first and second lines of the first wiring pattern and the third and fourth lines of the second wiring pattern can be arranged such that any one of the first and second lines is located between the third and fourth lines and any one of the third and fourth lines is located between the first and second lines with a simple configuration. Accordingly, the characteristic impedances of the first and second wiring patterns can be easily reduced at low cost.

Other features, elements, characteristics, and advantages of the present invention will become more apparent from the following description of preferred embodiments of the present invention with reference to the attached drawings.

BRIEF DESCRIPTION OF THE DRAWINGS

FIG. 4 is a plan view and a sectional view showing details of an intersection region of FIG. 2.

FIG. 5 is a plan view schematically showing linked portions of lines of the write wiring pattern.

FIG. 6 is a diagram for explaining characteristic impedances of the write wiring patterns.

FIG. 9 is a diagram showing results of measurement of the characteristic impedances of the write wiring patterns.

DESCRIPTION OF THE PREFERRED EMBODIMENTS

Figure 1:
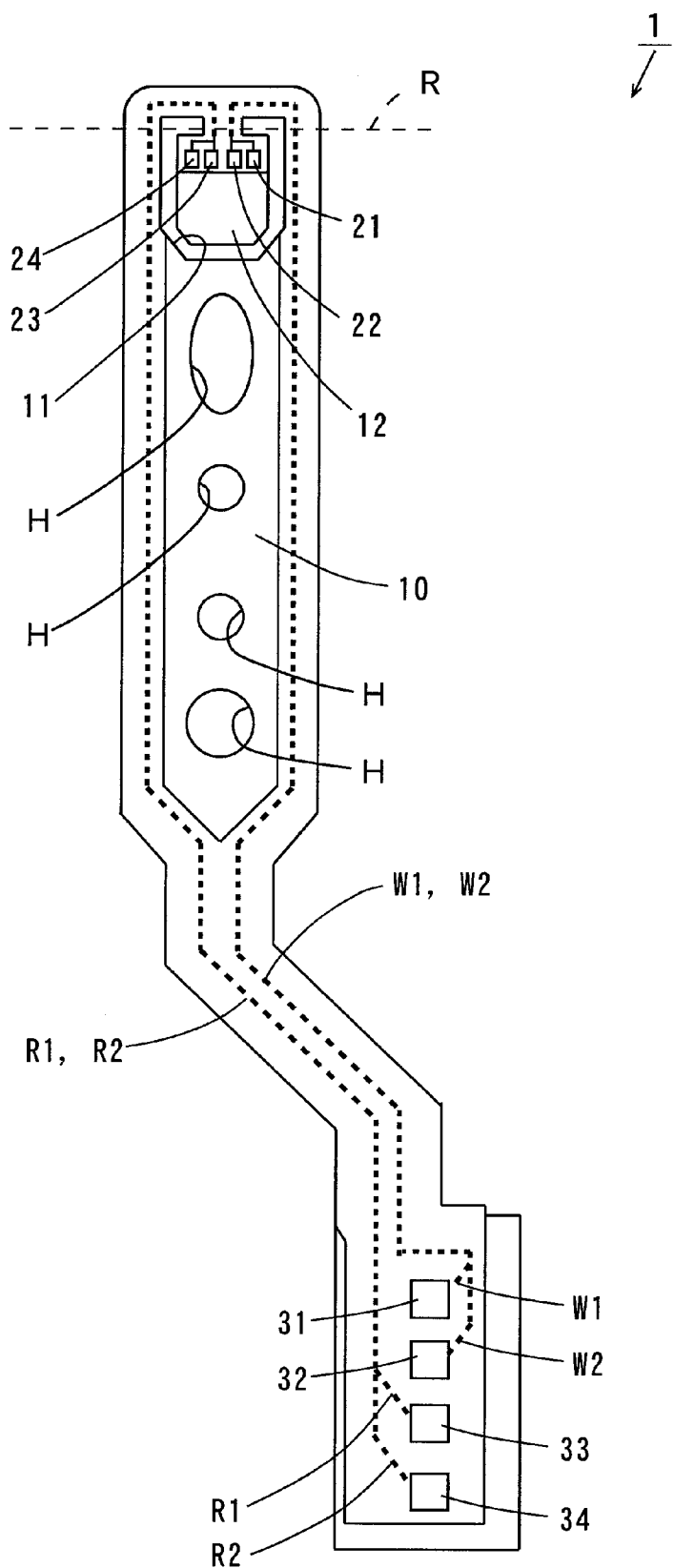
FIG. 1 is a plan view of a suspension board according to one embodiment of the present invention.

Hereinafter, a printed circuit board and a method of manufacturing the same according to one embodiment of the present invention will be described while referring to the drawings. Description will be made of the configuration and manufacturing method of a suspension board used in an actuator of a hard disk drive as the printed circuit board according to the one embodiment of the present invention.

(1) Configuration of the Suspension Board

FIG. 1 is a top view of the suspension board according to the one embodiment of the present invention. As shown in FIG. 1, the suspension board 1 includes a suspension body 10 formed of a long-sized metal substrate. Write wiring patterns W1, W2 and read wiring patterns R1, R2 are formed on the suspension body 10 as indicated by the bold dotted lines. The write wiring pattern W1 and the write wiring pattern W2 constitute a signal line pair. The read wiring pattern R1 and the read wiring pattern R2 constitute a signal line pair.

At an end of the suspension body 10, a U-shaped opening 11 is formed to provide a magnetic head supporting portion (hereinafter referred to as a tongue) 12. The tongue 12 is bent along the broken line R to form a predetermined angle with respect to the suspension body 10. Four electrode pads 21, 22, 23, 24 are formed at an end of the tongue 12.

Four electrode pads 31, 32, 33, 34 are formed at the other end of the suspension body 10. The electrode pads 21 to 24 on the tongue 12 and the electrode pads 31 to 34 at the other end of the suspension body 10 are electrically connected to one another through the write wiring patterns W1, W2 and the read wiring patterns R1, R2, respectively. A plurality of holes H are formed in the suspension body 10.

In the hard disk, which is not shown, including the suspension board 1, a current flows through the pair of write wiring patterns W1, W2 at the time of writing information in the magnetic disk. Moreover, the current flows through the pair of read wiring patterns R1, R2 at the time of reading information from the magnetic disk.

(2) The Write Wiring Patterns

Figure 2:
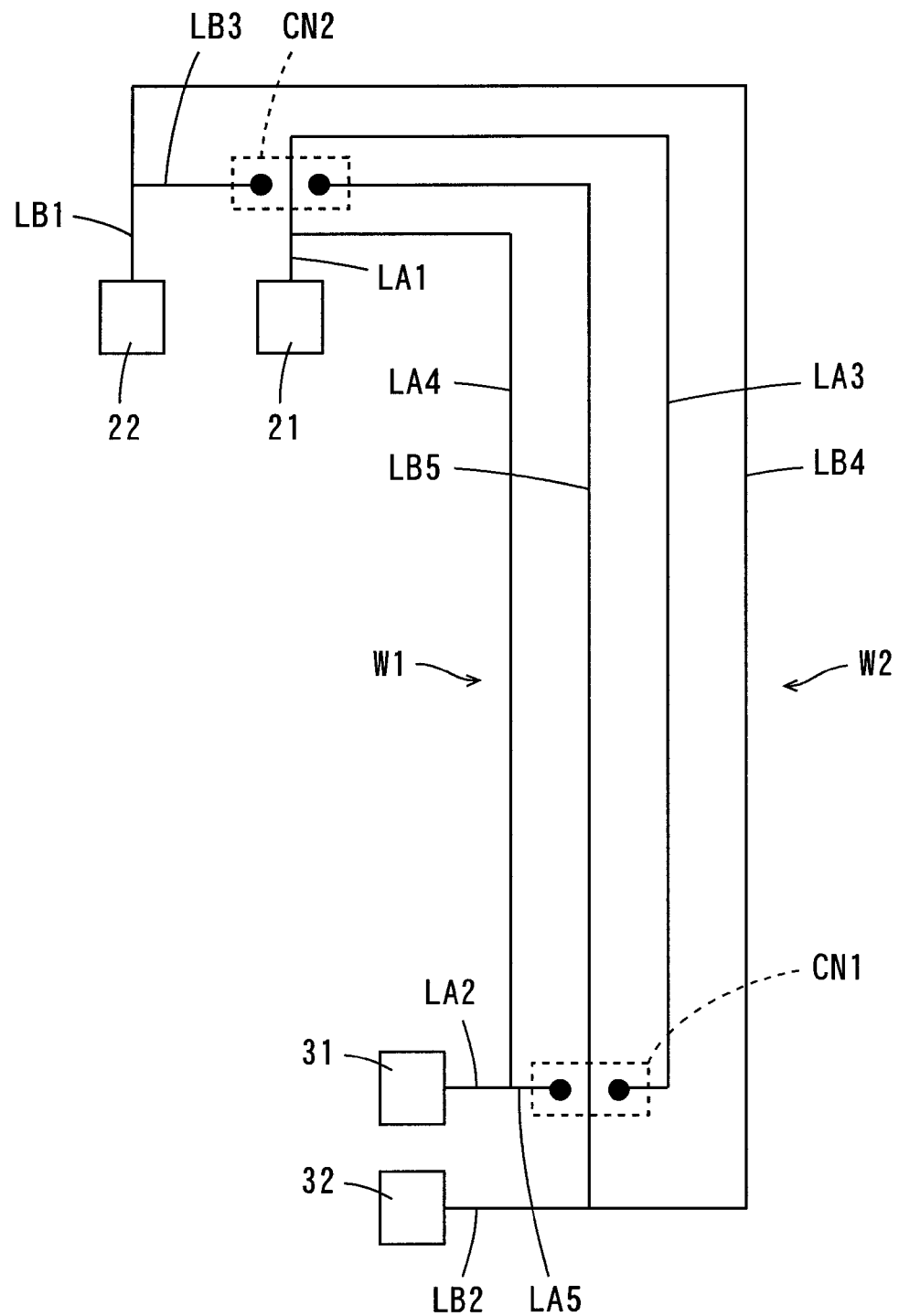
FIG. 2 is a schematic diagram showing the configurations of write wiring patterns.

Next, detail description will be made of the configurations of the write wiring patterns W1, W2. FIG. 2 is a schematic diagram showing the configurations of the write wiring patterns W1, W2.

As shown in FIG. 2, the write wiring pattern W1 is constituted by lines LA1 to LA5. The line LA1 is connected to the electrode pad 21, and the line LA2 is connected to the electrode pad 31.

One ends of the lines LA3, LA4 are integrated with the line LA1. The other end of the line LA3 and an end of the line LA5 are electrically connected to each other in an intersection region CN1. Details of the intersection region CN1 will be described later. The other ends of the lines LA4, LA5 are integrated with the line LA2.

The write wiring pattern W2 is constituted by lines LB1 to LB5. The line LB1 is connected to the electrode pad 22, and the line LB2 is connected to the electrode pad 32.

One ends of the lines LB3, LB4 are integrated with the line LB1. The other end of the line LB3 and one end of the line LB5 are electrically connected to each other in an intersection region CN2. Details of the intersection region CN2 will be described later. The other ends of the lines LB4, LB5 are integrated with the line LB2.

The lines LA3, LA4 of the write wiring pattern W1 and the lines LB4, LB5 of the write wiring pattern W2 are arranged such that the line LA3 is located between the lines LB4, LB5 and the line LB5 is located between the lines LA3, LA4 while the lines LA3, LA4 and the lines LB4, LB5 are arranged in parallel with one another. The line LA3 of the write wiring pattern W1 extends to pass through a portion in between the ends of the lines LB3, LB5 of the write wiring pattern W2 in the intersection region CN2, and the line LB5 of the write wiring pattern W2 extends to pass through a portion in between the ends of the lines LA3, LA5 of the write wiring pattern W1 in the intersection region CN1.

Figure 3:
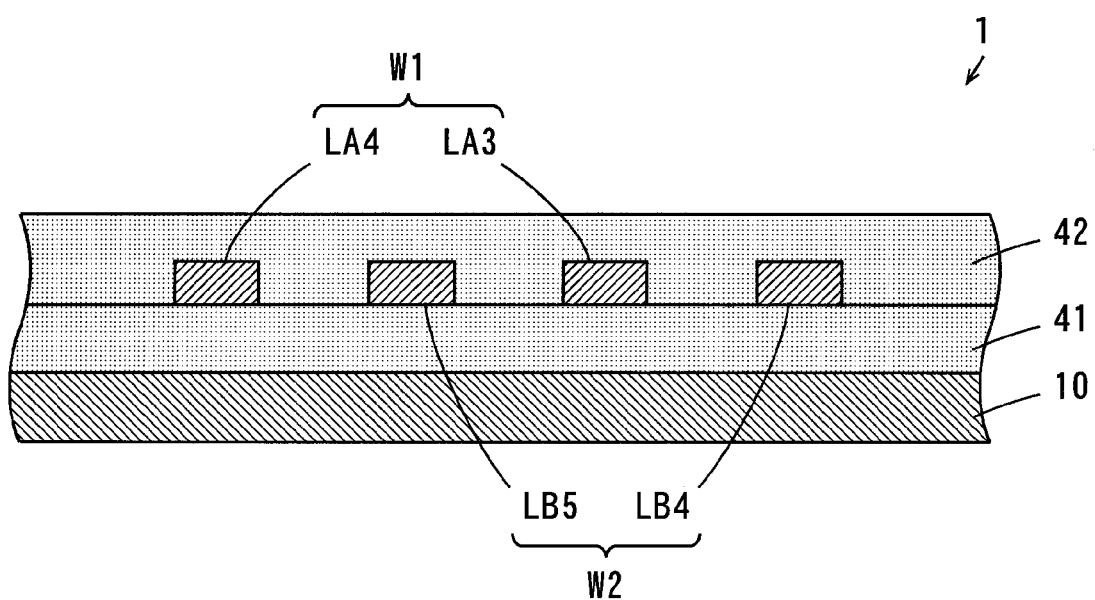
FIG. 3 is a schematic sectional view of part of the write wiring patterns.

FIG. 3 is a schematic sectional view of the lines LA3, LA4, LB4, LB5 of the write wiring patterns W1, W2 and the periphery thereof.

As shown in FIG. 3, a base insulating layer 41 is formed on the suspension body 10. The lines LA3, LA4, LB4, LB5 of the write wiring patterns W1, W2 are formed on the base insulating layer 41. A cover insulating layer 42 is formed on the base insulating layer 41 to cover the write wiring patterns W1, W2.

FIG. 4(a) is a plan view showing details of the intersection region CN1 of FIG. 2, and FIG. 4(b) is a sectional view taken along the line B-B of FIG. 4(a). Note that the intersection region CN2 has the same configuration as the intersection region CN1.

As shown in FIGS. 4(a) and (b), an annular opening OP is formed in the suspension body 10. Thus, an island-shaped region RG1 that is electrically separated from other regions of the suspension body 10 is formed. The line LB5 of the write wiring pattern W2 is arranged to extend through the region RG1 of the suspension body 10, and the end of the line LA3 and the end of the line LA5 of the write wiring pattern W1 are arranged on both sides of the line LB5.

Circular connection portions G1, G2 are provided at the ends of the line LA3 and the line LA5, respectively. In addition, through holes H11, H12 are formed in portions of the base insulating layer 41 below the connection portions G1, G2, respectively. Each of the through holes H11, H12 is formed in a tapered shape such that the diameter thereof is gradually reduced as approaching a lower surface from an upper surface of the base insulating layer 41. The connection portion G1 comes in contact with the region RG1 of the suspension body 10 within the through hole H11, and the connection portion G2 comes in contact with the region RG1 of the suspension body 10 within the through hole H12. This causes the lines LA3, LA5 to be electrically connected to each other through the region RG1 of the suspension body 10.

The diameter of the connection portion G1 is preferably larger than the width of the line LA3, and the diameter of the connection portion G2 is preferably larger than the width of the line LA5. In addition, the diameter of the through hole H11 of the base insulating layer 41 is preferably larger than the width of the line LA3, and the diameter of the through hole H12 is preferably larger than the width of the line LA5. Thus, the electrical connection between the lines LA3, LA5 is sufficiently ensured.

Note that the width WC of the region RG1 of the suspension body 10 is preferably constant in its portion between a contact portion of the region RG1 with the connection portion G1 and a contact portion of the region RG1 with the connection portion G2. In this case, transmission loss in the region RG1 of the suspension body 10 is decreased.

The shape of each of the connection portions G1, G2 is not limited to the circular shape. For example, another shape such as an elliptical shape, a triangular shape, a quadrangular shape and a shape of a sector may be employed. The transverse cross sectional shape of each of the through holes H11, H12 may be another shape such as an elliptical shape, a triangular shape, a quadrangular shape and a shape of a sector.

Next, description is made of the width of each of the lines constituting the write wiring patterns W1, W2. FIG. 5(a) schematically shows a linked portion of the lines LA1, LA3, LA4 of the write wiring pattern W1, and FIG. 5(b) schematically shows a linked portion of the lines LA2, LA4, LA5.

As shown in FIGS. 5(a) and (b), the widths w1, w2 of the lines LA1, LA2 of the write wiring pattern W1 are equal to each other. The lines LA3, LA4, LA5 have equal widths w3, w4, w5, each of which is smaller than each of the widths w1, w2 of the lines LA1, LA2.

Each of the widths w3, w4, w5 of the lines LA3, LA4, LA5 is preferably half each of the widths w1, w2 of the lines LA1, LA2. In this case, the characteristic impedances of the lines LA3, LA4 are substantially equal to the characteristic impedance of the line LA1, and the characteristic impedances of the lines LA4, LA5 are substantially equal to the characteristic impedance of the line LA2. This reduces the transmission loss in the write wiring pattern W1.

Similarly, the widths of the lines LB1, LB2 of the write wiring pattern W2 are equal to each other. The lines LB3, LB4, LB5 have equal widths, each of which is smaller than the width of each of the lines LB1, LB2.

The width of each of the lines LB3, LB4, LB5 is preferably half the width of each of the lines LB1, LB2. In this case, the characteristic impedances of the lines LB3, LB4 are substantially equal to the characteristic impedance of the line LB1, and the characteristic impedances of the lines LB4, LB5 are substantially equal to the characteristic impedance of the line LB2. This reduces the transmission loss in the write wiring pattern W2.

(3) The Characteristic Impedances of the Write Wiring Patterns W1, W2

As described above, the lines LA3, LA4 constituting the write wiring pattern W1 and the lines LB4, LB5 constituting the write wiring pattern W2 are arranged such that the line LA3 is located between the lines LB4, LB5 and the line LB5 is located between the lines LA3, LA4 while the lines LA3, LA4 and the lines LB4, LB5 are arranged in parallel with one another in the present embodiment. In this case, the characteristic impedances of the write wiring patterns W1, W2 can be decreased. The reason will be described with reference to FIG. 6.

FIG. 6(a) shows the lines LA3, LA4, LB4, LB5 of the write wiring patterns W1, W2 and the periphery thereof. FIG. 6(b) shows an example of the write wiring patterns W1, W2 each composed of one line.

The characteristic impedances of the write wiring patterns W1, W2 are decreased with increasing the capacitances of the write wiring patterns W1, W2. The capacitances are increased with increasing the area in which the write wiring pattern W1 and the write wiring pattern W2 are opposite to each other.

That is, the characteristic impedances of the write wiring patterns W1, W2 are decreased with increasing the area in which the write wiring pattern W1 and the write wiring pattern W2 are opposite to each other.

In the configuration shown in FIG. 6(a), one side surface of the line LA4 of the write wiring pattern W1 and one side surface of the line LB5 of the write wiring pattern W2 are opposite to each other, the other side surface of the line LB5 of the write wiring pattern W2 and one side surface of the line LA3 of the write wiring pattern W1 are opposite to each other, and the other side surface of the line LA3 of the write wiring pattern W1 and one side surface of the line LB4 of the write wiring pattern W2 are opposite to each other. The total of the opposite areas corresponds to the area in which the write wiring pattern W1 and the write wiring pattern W2 are opposite to each other.

On the other hand, in the configuration shown in FIG. 6(b), only one side surface of the one line of the write wiring pattern W1 and one side surface of the one line of the write wiring pattern W2 are opposite to each other. The opposite area corresponds to the area in which the write wiring pattern W1 and the write wiring pattern W2 are opposite to each other.

Accordingly, the lines LA3, LA4 constituting the write wiring pattern W1 and the lines LB4, LB5 constituting the write wiring pattern W2 are arranged such that the line LA3 is located between the lines LB4, LB5 and the line LB5 is located between the lines LA3, LA4 while the lines LA3, LA4 and the lines LB4, LB5 are arranged in parallel with one another to cause the characteristic impedances of the write wiring patterns W1, W2 to be reduced as compared with the case where the write wiring patterns W1, W2 are each composed of the one line.

Moreover, the suspension body 10 is provided to be opposite to the write wiring patterns W1, W2 with the base insulating layer 41 sandwiched therebetween in the present embodiment, thus further increasing the capacitances of the write wiring patterns W1, W2. This results in the further reduced characteristic impedances of the write wiring patterns W1, W2.

(4) Method of Manufacturing the Suspension Board

Figure 7:
FIG. 7 is a vertical sectional view showing steps of manufacturing the suspension board.
Figure 7:
Figure 7:
Figure 7:
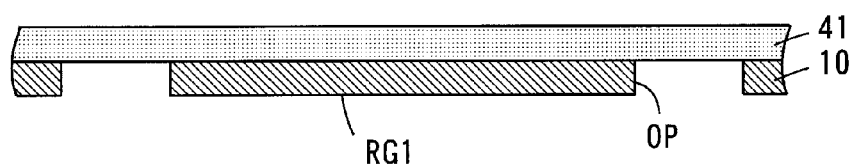
Figure 7:
Figure 7:
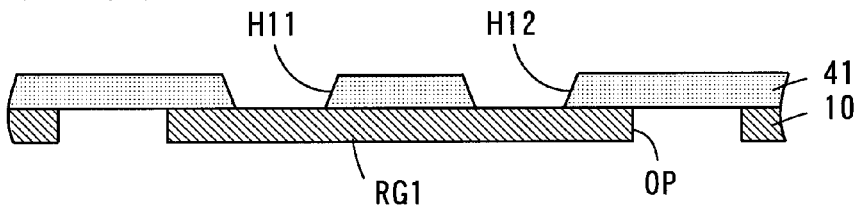
Figure 8:
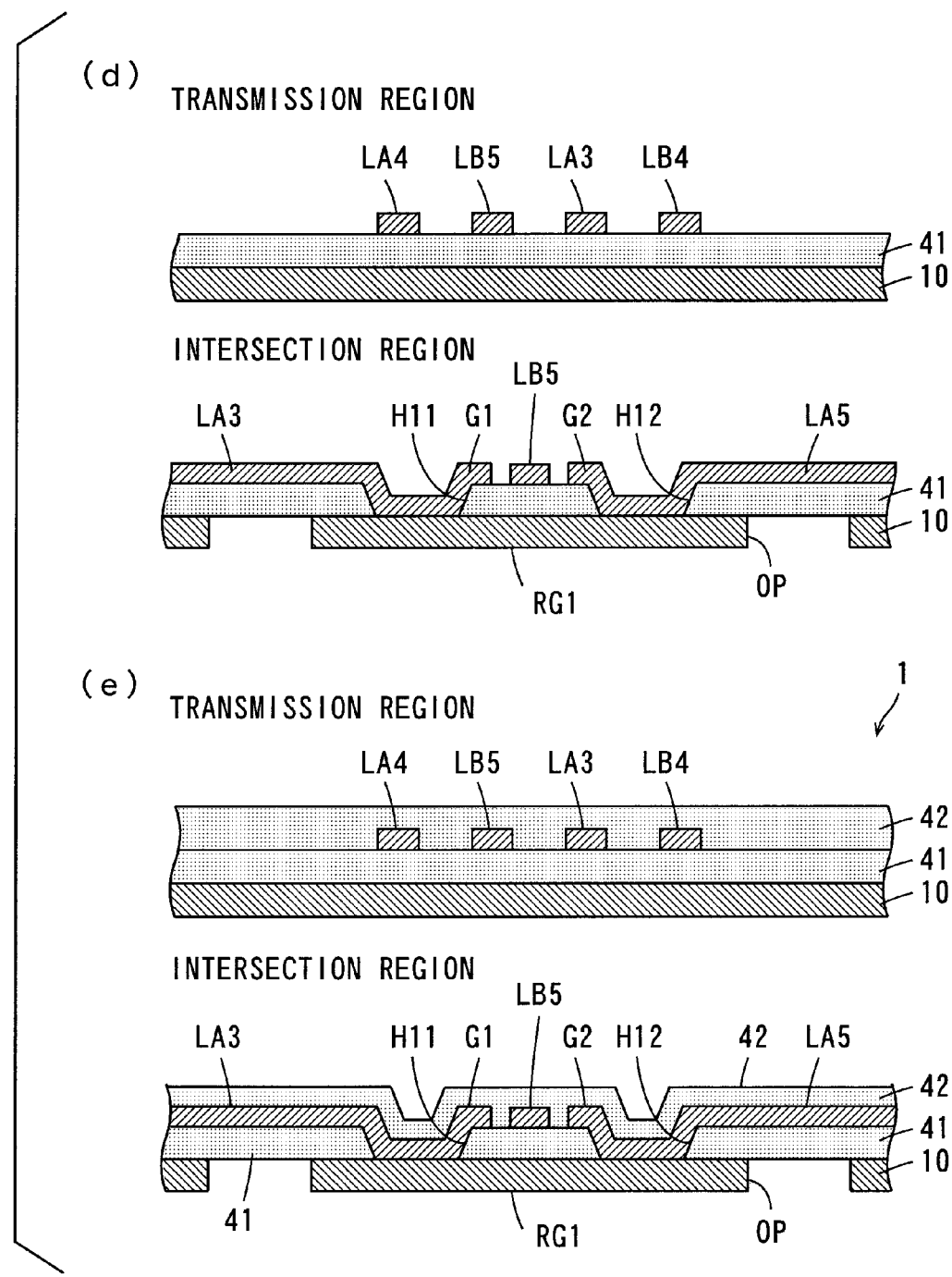
FIG. 8 is a vertical sectional view showing steps of manufacturing the suspension board.

Next, description is made of the method of manufacturing the suspension board 1. FIGS. 7 and 8 are vertical sectional views showing steps of manufacturing the suspension board 1. Here, description is made of steps of manufacturing the lines LA3, LA4, LB4, LB5 of the write wiring patterns W1, W2 and the periphery thereof (hereinafter referred to as a transmission region) shown in FIG. 3 and steps of manufacturing the intersection region CN1 shown in FIG. 4. Upper stages of FIG. 7(a) to FIG. 8(e) show the steps of manufacturing the transmission region, and lower stages show the steps of manufacturing the intersection region CN1.

First, the base insulating layer 41 made of polyimide, for example, is laminated on the suspension body 10 of stainless steel, for example, using an adhesive as shown in FIG. 7(a).

The thickness of the suspension body 10 is not less than 5 μm and not more than 50 μm, for example, and preferably not less than 10 μm and not more than 30 μm. Instead of stainless steel, another metal such as aluminum or an alloy, for example, may be used as the suspension body 10.

The thickness of the base insulating layer 41 is not less than 1 μm and not more than 15 μm, for example, and preferably not less than 2 μm and not more than 12 μm. Instead of polyimide, another insulating material such as epoxy resin may be used as the base insulating layer 41.

Next, the annular opening OP is formed in the suspension body 10 by etching, for example, in the intersection region CN1 as shown in FIG. 7(b). Accordingly, the region RG1 that is separated from other regions is formed in the suspension body 10. The area of the region RG1 is not less than 3200 μm$^2$ and not more than 180000 μm$^2$, for example, and preferably not less than 5000 μm$^2$ and not more than 80000 μm$^2$.

In the intersection region CN1, the through holes H11, H12 are then formed by etching using a laser or wet etching, for example, in portions of the base insulating layer 41 above the region RG1 as shown in FIG. 7(c). The diameter of each of the through holes H11, H12 is not less than 20 μm and not more than 200 μm, for example, and preferably not less than 40 μm and not more than 100 μm.

The write wiring patterns W1, W2 made of copper, for example, are subsequently formed on the base insulating layer 41 as shown in FIG. 8(d). In the transmission region, the lines LA3, LA4 as the write wiring pattern W1 and the lines LB4, LB5 as the write wiring pattern W2 are arranged such that the line LA3 is located between the lines LB4, LB5 and the line LB5 is located between the lines LA3, LA4 while the lines LA3, LA4 and the lines LB4, LB5 are arranged in parallel with one another.

The lines LA3, LA5 as the write wiring pattern W1 and the line LB5 as the write wiring pattern W2 are formed in the intersection region CN1. The connection portions G1, G2 are formed at the ends of the lines LA3, LA5. The diameter of each of the connection portions G1, G2 is not less than 30 μm and not more than 300 μm, for example, and preferably not less than 50 μm and not more than 150 μm.

The write wiring patterns W1, W2 may be formed using a semi-additive method, for example, and may be formed using another method such as a subtractive method.

The thickness of each of the write wiring patterns W1, W2 is not less than 3 μm and not more than 16 μm, for example, and preferably not less than 6 μm and not more than 13 μm. The width of each of the lines LA1, LA2, LB1, LB2 of the write wiring patterns W1, W2 is not less than 20 μm and not more than 200 μm, for example, and preferably not less than 30 μm and not more than 100 μm. The width of each of the lines LA3 to LA5, LB3 to LB5 is not less than 10 μm and not more than 150 μm, for example, and preferably not less than 12 μm and not more than 80 μm.

The material for the write wiring patterns W1, W2 is not limited to copper. For example, another metal such as gold (Au) and aluminum or an alloy such as a copper alloy and an aluminum alloy may be used.

Next, the cover insulating layer 42 made of polyimide, for example, is formed on the base insulating layer 41 to cover the write wiring patterns W1, W2 as shown in FIG. 8(e). The thickness of a portion of the cover insulating layer 42 above the write wiring patterns W1, W2 is not less than 4 μm and not more than 26 μm, for example, and preferably not less than 5 μm and not more than 21 μm. Instead of polyimide resin, another insulating material such as epoxy resin may be used as the cover insulating layer 42.

In this manner, the suspension board 1 is completed.

(5) Effects

In the suspension board 1 according to the present embodiment, the lines LA3, LA4 constituting the write wiring pattern W1 and the lines LB4, LB5 constituting the write wiring pattern W2 are arranged such that the line LA3 is located between the lines LB4, LB5 and the line LB5 is located between the lines LA3, LA4 while the lines LA3, LA4 and the lines LB4, LB5 are arranged in parallel with one another in the same plane. This reduces the characteristic impedances of the write wiring patterns W1, W2.

The suspension body 10 is opposite to the lines LA3, LA4, LB4, LB5 with the base insulating layer 41 sandwiched therebetween, thus further decreasing the characteristic impedances of the write wiring patterns W1, W2.

Moreover, the lines LA3, LA5 of the write wiring pattern W1 are electrically connected to each other through the suspension body 10 in the intersection region CN1, and the lines LB3, LB5 of the write wiring pattern W2 are electrically connected to each other through the suspension body 10 in the intersection region CN2 in the present embodiment.

In this case, the line LB5 of the write wiring pattern W2 can be arranged to pass through the portion in between the lines LA3, LA5 of the write wiring pattern W1, and the line LA3 of the write wiring pattern W1 can be arranged to pass through the portion in between the lines LB3, LB5 of the write wiring pattern W2. Therefore, the lines LA3, LA4 of the write wiring pattern W1 and the lines LB4, LB5 of the write wiring pattern W2 can be arranged such that the line LA3 is located between the lines LB4, LB5 and the line LB5 is located between the lines LA3, LA4 while the lines LA3, LA4 and the lines LB4, LB5 are arranged in parallel with one another. Accordingly, the electrical connection between the electrode pads 21, 31 and between the electrode pads 22, 32 can be ensured and the characteristic impedances of the write wiring patterns W1, W2 can be decreased with the simple configuration.

In addition, the connection configuration using the suspension body 10 eliminates the necessity of separately forming another layer, preventing the manufacturing steps from being complicated. Furthermore, the thickness of the suspension board 1 can be decreased as compared with the case where another layer is separately formed.

Since the intersection region CN1 and the intersection region CN2 have the same configuration, the transmission loss in the intersection region CN1 and the transmission loss in the intersection region CN2 are substantially equal to each other. This does not cause the transmission characteristics of the write wiring pattern W1 to be greatly different from the transmission characteristics of the write wiring pattern W2. As a result, an operation of writing in the magnetic disk can be appropriately performed.

(6) INVENTIVE EXAMPLE AND COMPARATIVE EXAMPLES

(6-1) Inventive Example

The suspension board 1 shown in FIGS. 1 to 5 was manufactured as an inventive example. Stainless steel was used as the material of the suspension body 10, polyimide was used as the material of the base insulating layer 41 and the cover insulating layer 42, and copper was used as the material of the write wiring patterns W1, W2. The thickness of the suspension body 10 was 20 µm, the thickness of the base insulating layer 41 was 10 µm, the thickness of each of the write wiring patterns W1, W2 was 12 µm, and the thickness of the portion of the cover insulating layer 42 above the write wiring patterns W1, W2 was 5 µm.

The widths of the lines LA3 to LA5, LB3 to LB5 of the write wiring patterns W1, W2 were set to be equal to one another in a range from 15 µm to 100 µm, and the width of each of the lines LA1, LA2, LB1, LB2 was twice as wide as the width of each of the lines LA3 to LA5, LB3 to LB5. In addition, each of intervals between the lines LA3, LA4, LB4, LB5 in the transmission region was 15 µm.

The diameter of each of the through holes H11, H12 of the base insulating layer 41 was 80 µm, and the diameter of each of the connection portions G1, G2 of the lines LA3, LA5, LB3, LB5 was 140 µm in the intersection regions CN1, CN2.

(6-2) Comparative Example 1

A suspension board of a comparative example 1 is different from the suspension board 1 of the inventive example in that the write wiring patterns W1, W2 are each composed of one line (see FIG. 6(b)). Note that the widths of the write wiring patterns W1, W2 were set to be equal to each other in a range from 15 µm to 100 µm.

(6-3) Comparative Example 2

A suspension board of a comparative example 2 is different from the suspension board 1 of the inventive example in that the suspension body 10 is not provided in the transmission region.

(6-4) Evaluation

The characteristic impedances of the write wiring patterns W1, W2 were measured in the inventive example and the comparative examples 1,2. The results are shown in FIG. 9. In FIG. 9, the abscissa indicates the width of each of the write wiring patterns W1, W2. In this case, the abscissa indicates the width of each of the lines LA3 to LA5, LB3 to LB5 in the inventive example and the comparative example 2, and indicates the width of the one line of each of the write wiring patterns W1, W2 in the comparative example 1. The ordinate indicates the characteristic impedances of the write wiring patterns W1, W2.

As shown in FIG. 9, the characteristic impedances of the write wiring patterns W1, W2 in the inventive example were smaller than the characteristic impedances of the write wiring patterns W1, W2 in the comparative examples 1, 2.

The results show that the lines LA3, LA4 constituting the write wiring pattern W1 and the lines LB4, LB5 constituting the write wiring pattern W2 were arranged such that the line LA3 was located between the lines LB4, LB5 and the line LB5 was located between the lines LA3, LA4 while the lines LA3, LA4 and the lines LB4, LB5 were arranged in parallel with one another to cause the characteristic impedances of the write wiring patterns W1, W2 to be reduced as compared with the case where the write wiring patterns W1, W2 were each composed of the one line.

In addition, it was found that the suspension body 10 was provided to be opposite to the lines LA3, LA4, LB4, LB5 in the transmission region to cause the characteristic impedances of the write wiring patterns W1, W2 to be reduced.

Moreover, the results show that the lines LA3, LA5 of the write wiring pattern W1 were electrically connected to each other and the lines LB3, LB5 of the write wiring pattern W2 were electrically connected to each other in the intersection regions CN1, CN2, so that the electrical connection between the electrode pads 21, 31 and between the electrode pads 22, 32 is ensured.

(7) Another Manufacturing Method

Figure 10:
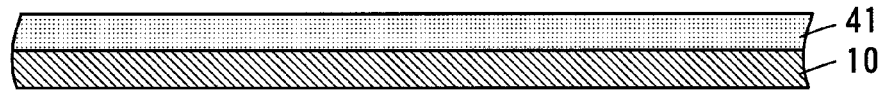
FIG. 10 is a vertical sectional view showing another steps of manufacturing the suspension board.
Figure 10:
Figure 10:
Figure 10:
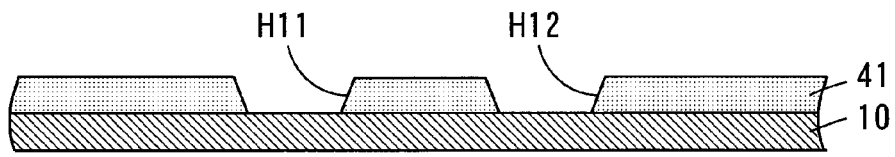
Figure 10:
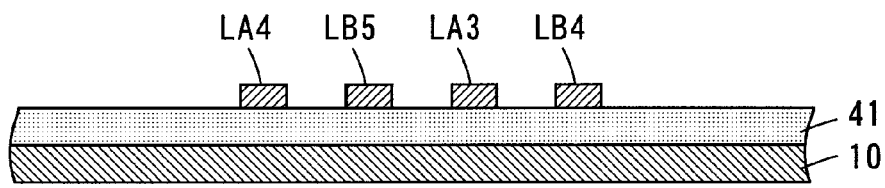
Figure 10:
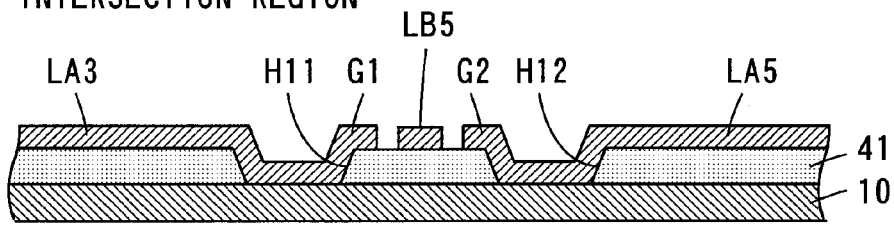
Figure 11:
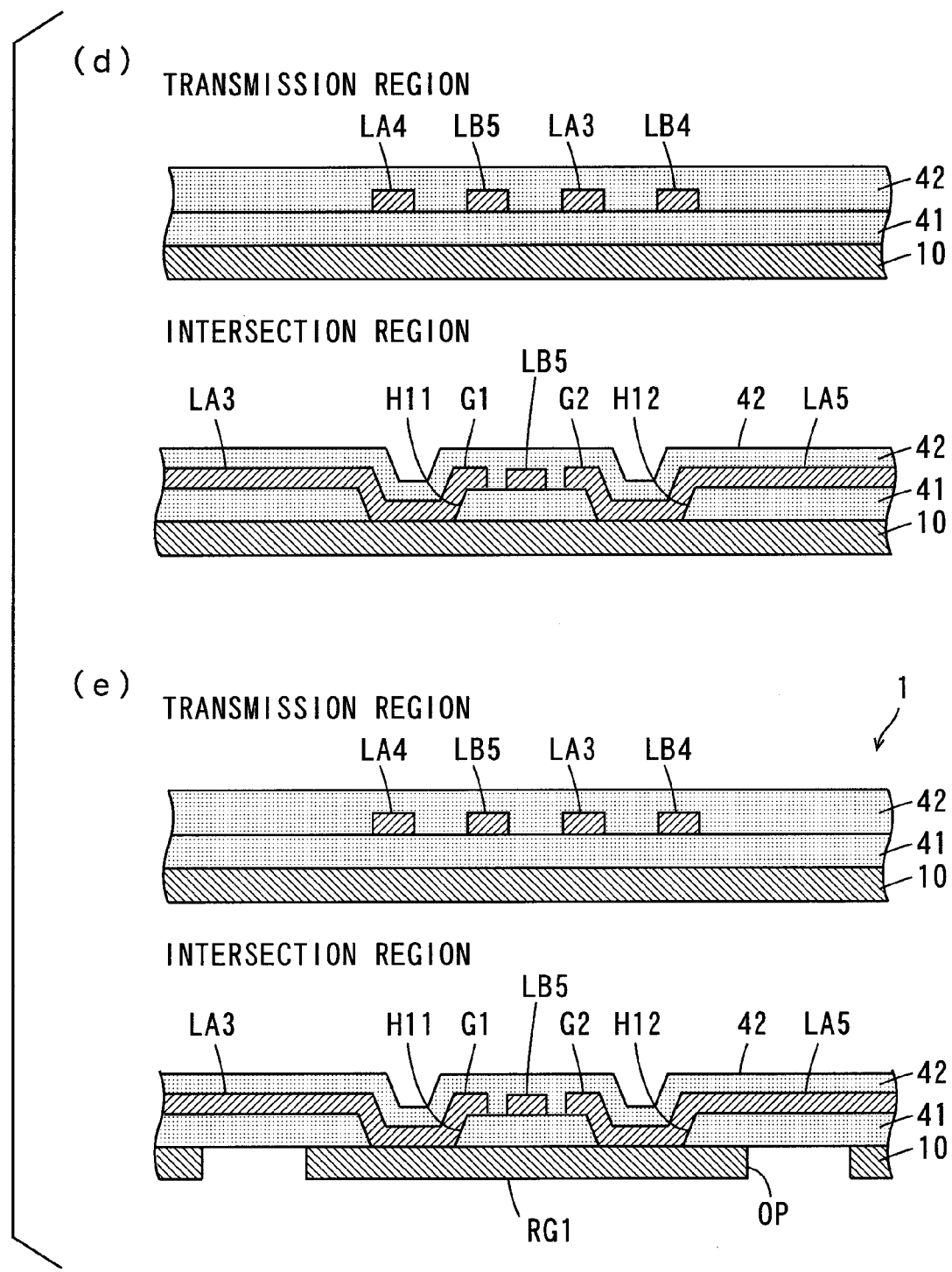
FIG. 11 is a vertical sectional view showing the another steps of manufacturing the suspension board.

Description is made of another method of manufacturing the suspension board 10. FIGS. 10 and 11 are vertical sectional views showing another steps of manufacturing the suspension board 10. An example in FIGS. 10 and 11 is described by referring to differences from the example shown in FIGS. 7 and 8.

As shown in FIG. 10(a), the base insulating layer 41 is laminated on the suspension body 10, similarly to the example of FIGS. 7 and 8. Next, the through holes H11, H12 are formed by etching using a laser or wet etching, for example, in predetermined portions of the base insulating layer 41 in the intersection region CN1 as shown in FIG. 10(b).

Then, as shown in FIG. 10(c) and FIG. 11(d), the write wiring patterns W1, W2 are formed on the base insulating layer 41 and the cover insulating layer 42 is formed on the base insulating layer 41 to cover the write wiring patterns W1, W2, similarly to the example of FIGS. 7 and 8.

The annular opening OP is subsequently formed in the suspension body 10 by etching, for example, in the intersection region CN1 as shown in FIG. 11(e). This causes the region RG1, which is separated from the other regions, to be formed in the suspension body 10. As a result, the suspension board 1 is completed.

As described above, the write wiring patterns W1, W2 and the cover insulating layer 42 are formed on the base insulating layer 41, and the opening OP is then formed in the suspension body 10 in the example of FIGS. 10 and 11.

(8) Other Embodiments

(8-1)

The configurations of the write wiring patterns W1, W2, the positions of the intersection regions and so on may be suitably changed according to the positions of the electrode pads 21, 22, 31, 32, and so on.

Figure 12:
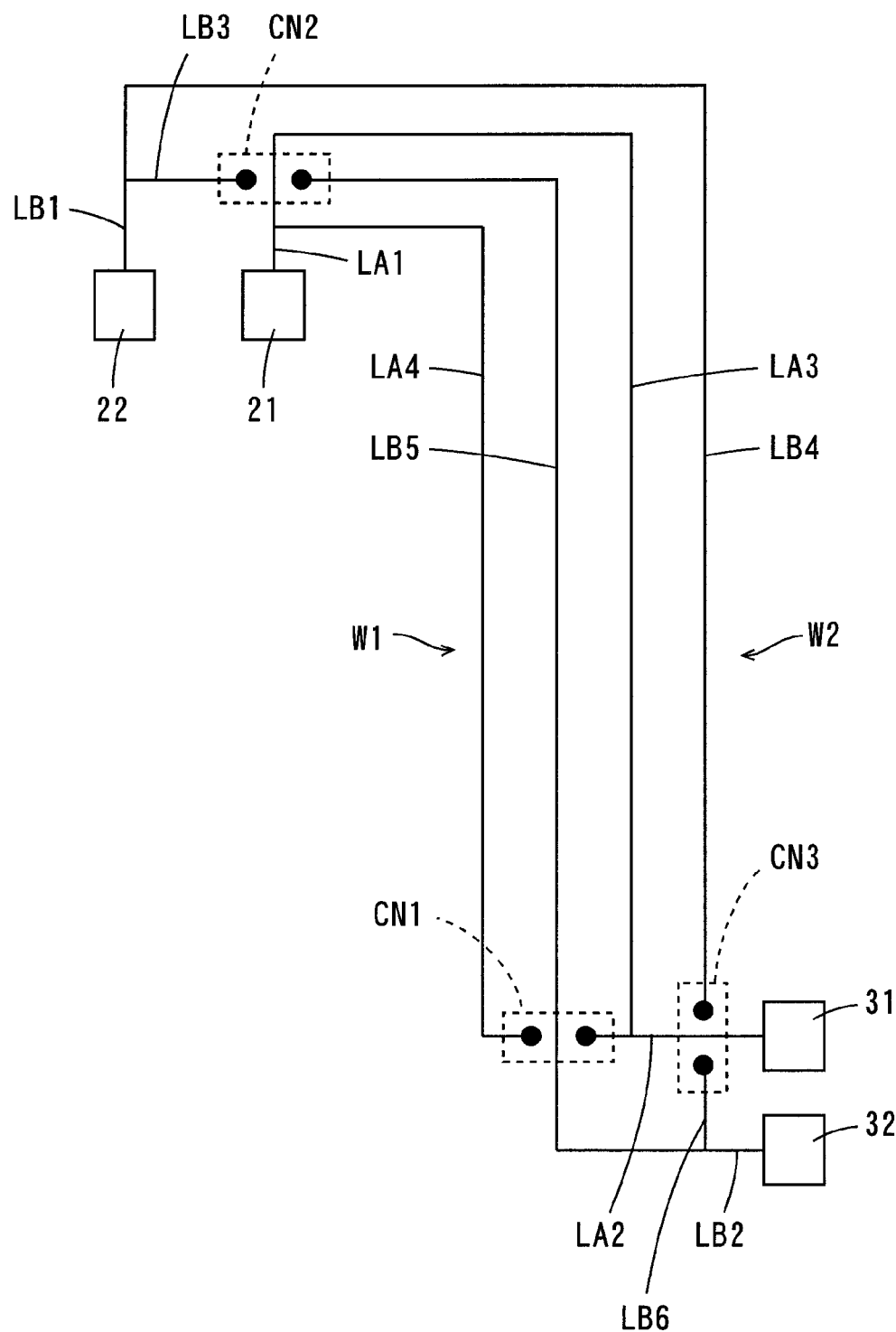
FIG. 12 is a diagram showing another example of the configurations of the write wiring patterns.

FIG. 12 is a diagram showing another example of the configurations of the write wiring patterns W1, W2. In the example of FIG. 12, the line LB4 of the write wiring pattern W2 is electrically connected to a line LB6 through an intersection region CN3. The intersection region CN3 has the same configuration as the intersection regions CN1, CN2. The line LB6 is integrated with the line LB2. The line LA2 of the write wiring pattern W1 is connected to the line LA3, and arranged to pass through a portion in between the line LB4 and the line LB6 of the write wiring pattern W2.

Also in this case, the electrical connection between the electrode pads 21, 31 and between the electrode pads 22, 32 can be ensured and the characteristic impedances of the write wiring patterns W1, W2 can be decreased.

(8-2)

Figure 13:
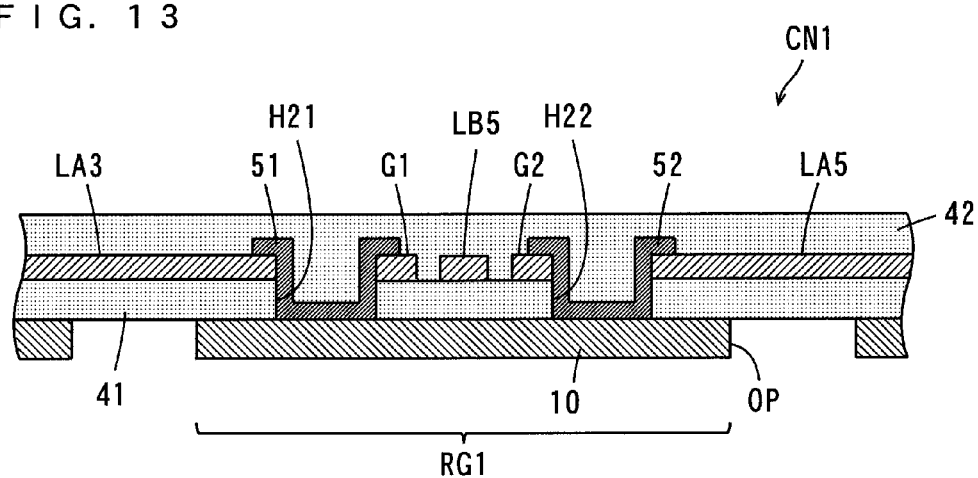
FIG. 13 is a diagram showing another example of the configuration of the intersection region.
Figure 14:
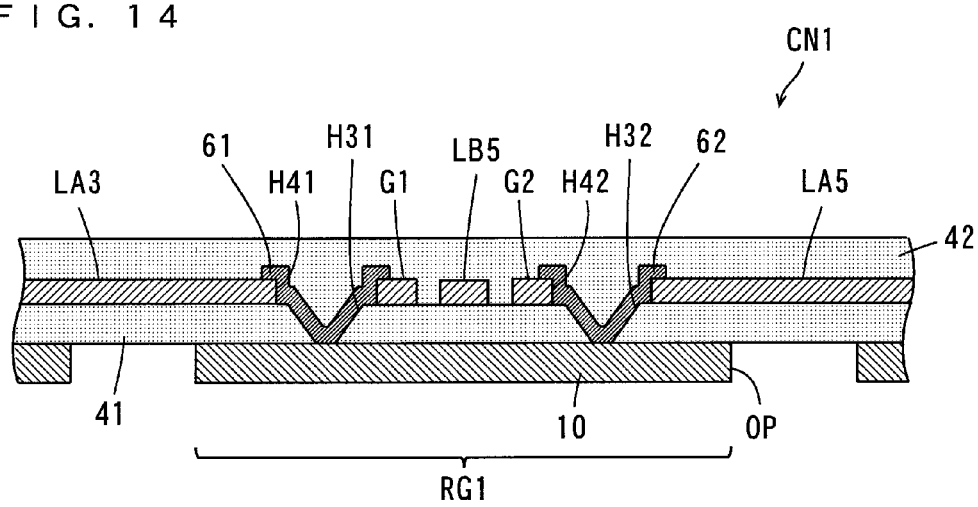
FIG. 14 is a diagram showing still another example of the configuration of the intersection region.
Figure 15:
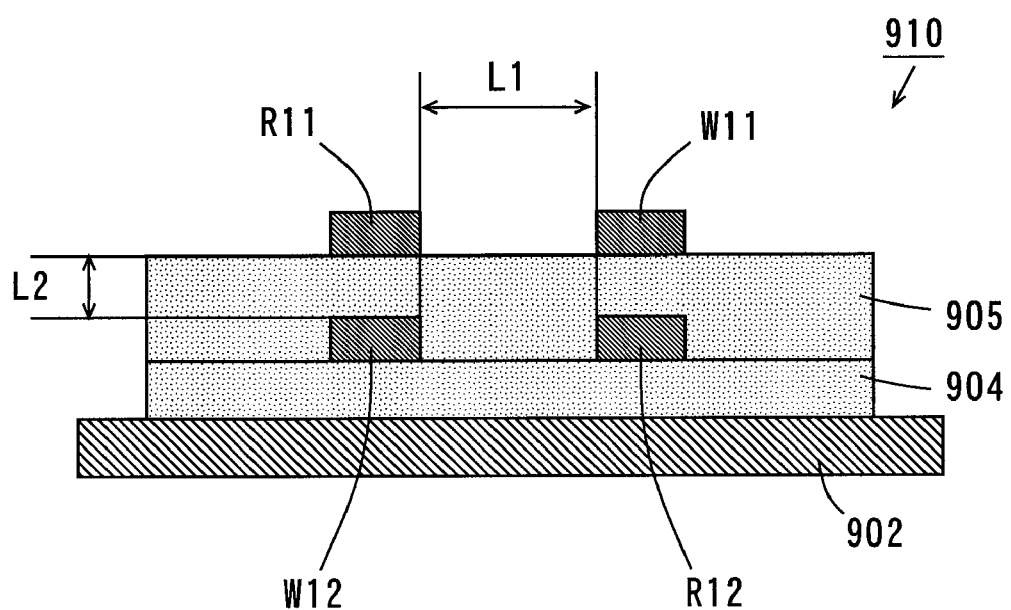
FIG. 15 is a vertical sectional view of a conventional suspension board.

The configurations of the intersection regions CN1, CN2 are not limited to the example shown in FIG. 4. FIGS. 13 and 14 are diagrams showing other examples of the configuration of the intersection region CN1. The intersection region CN2 may have the configuration shown in FIG. 13 or 14. The examples shown in FIGS. 13 and 14 are described by referring to differences from the example shown in FIG. 4.

Above the region RG of the suspension body 10, a through hole H21 is formed to pass through a portion of the connection portion G1 of the line LA3 and a portion of the base insulating layer 41 below the portion of the connection portion G1, and a through hole H22 is formed to pass through a portion of the connection portion G2 of the line LA5 and a portion of the base insulating layer 41 below the portion of the connection portion G2 in the example of FIG. 13. The area of each of the through holes H21, H22 in a transverse cross section is substantially constant in the vertical direction.

A connecting layer 51 is formed to cover the portion of the region RG1 of the suspension body 10 that is exposed inside the through hole H21, a side surface of the through hole H21, and a portion of an upper surface of the connection portion G1 in the periphery of the through hole H21. A connecting layer 52 is formed to cover the portion of the region RG1 of the suspension body 10 that is exposed inside the through hole H22, a side surface of the through hole H22, and a portion of an upper surface of the connection portion G2 in the periphery of the through hole H22.

The connecting layers 51, 52 are formed by metal plating such as nickel plating, silver plating, copper plating or gold plating. The connecting layers 51, 52 may be formed by applying a conductive paste such as a silver paste, and may be formed of solder.

The cover insulating layer 42 is formed on the base insulating layer 41 to cover the lines LA3, LA5, LB5, the connection portions G1, G2 and the connecting layers 51, 52.

In this case, the connection portion G1 of the line LA3 and the region RG1 of the suspension body 10 are electrically connected to each other through the connecting layer 51. In addition, the connection portion G2 of the line LA5 and the region RG1 of the suspension body 10 are electrically connected to each other through the connecting layer 52. That is, the lines LA3, LA5 are electrically connected to each other through the connecting layer 51, the region RG1 of the suspension board 10, and the connecting layer 52.

In the example of FIG. 14, through holes H31, H32 are formed in portions of the base insulating layer 41 above the region RG1 of the suspension body 10. Each of the through holes H31, H32 is formed in a tapered shape such that the diameter thereof is gradually reduced as approaching the lower surface from the upper surface of the base insulating layer 41. A through hole H41 is formed in a portion of the connection portion G1 above the through hole H31. The area of the through hole H41 in a transverse cross section is substantially constant in the vertical direction, and is larger than the area of an upper end opening of the through hole H31. A through hole H42 is formed in a portion of the connection portion G2 above the through hole H32. The area of the through hole H42 in a transverse cross section is substantially constant in the vertical direction, and is larger than an upper end opening of the through hole H32.

A connecting layer 61 is formed to cover a portion of the region RG1 of the suspension body 10 that is exposed inside the through hole H31, side surfaces of the through hole H31, H41 and a portion of the upper surface of the connection portion G1 in the periphery of the through hole H41. A connecting layer 62 is formed to cover a portion of the region RG1 of the suspension body 10 that is exposed inside the through hole H32, side surfaces of the through holes H32, H42 and a portion of the upper surface of the connection portion G2 in the periphery of the through hole H42.

The connecting layers 61, 62 are formed by metal plating such as nickel plating, silver plating, copper plating or gold plating. The connecting layers 61, 62 may be formed by applying a conductive paste such as a silver paste, and may be formed of solder.

The cover insulating layer 42 is formed on the base insulating layer 41 to cover the lines LA3, LA5, LB5, the connection portions G1, G2 and the connecting layers 61, 62.

In this case, the connection portion G1 of the line LA3 and the region RG1 of the suspension body 10 are electrically connected to each other through the connecting layer 61. In addition, the connection portion G2 of the line LA5 and the region RG1 of the suspension body 10 are electrically connected to each other through the connecting layer 62. That is, the lines LA3, LA5 are electrically connected to each other through the connecting layer 61, the region RG1 of the suspension board 10, and the connecting layer 62.

The line LB5 of the write wiring pattern W2 can be arranged to pass through the portion in between the lines LA3, LA5 of the write wiring pattern W1, and the line LA3 of the write wiring pattern W1 can be arranged to pass through the portion in between the lines LB3, LB5 of the write wiring pattern W2 also in the examples of FIGS. 13 and 14. Accordingly, the lines LA3, LA4 of the write wiring pattern W1 and the lines LB4, LB5 of the write wiring pattern W2 can be arranged such that the line LA3 is located between the lines LB4, LB5 and the line LB5 is located between the lines LA3, LA4 while the lines LA3, LA4 and the lines LB4, LB5 can be arranged in parallel with one another. This allows electrical connectivity between the electrode pads 21, 31, and the electrode pads 22, 32 to be ensured and the characteristic impedances of the write wiring patterns W1, W2 to be reduced with a simple configuration.

In addition, the connection configuration using the suspension board 10 prevents the manufacturing steps from being complicated.

Since the intersection region CN1 and the intersection region CN2 have the same configurations, the transmission losses are substantially equal in the intersection region CN1 and the intersection region CN2. This does not cause the transmission characteristics of the write wiring pattern W1 and the write wiring pattern W2 to be greatly different from each other. As a result, a write operation in a magnetic disk can be appropriately performed.

(9) Correspondences Between Elements in the Claims and Parts in Embodiments

In the following paragraphs, non-limiting examples of correspondences between various elements recited in the claims below and those described above with respect to various preferred embodiments of the present invention are explained.

In the foregoing embodiments, the base insulating layer 41 is an example of an insulating layer, the write wiring pattern W1 is an example of a first wiring pattern, the write wiring pattern W2 is an example of a second wiring pattern, the region RG1 of the suspension body 10 is an example of a first or second connecting layer, and the suspension body 10 is an example of a metal layer.

The lines LA3, LA5 are examples of a first line, the line LA4 is an example of a second line, the lines LB3, LB5 are examples of a third line, the line LB4 is an example of a fourth line, the line LA1 is an example of a fifth line, the line LA2 is an example of a sixth line, the line LB1 is an example of a seventh line, the line LB2 is an example of an eighth line, the intersection region CN1 is an example of a first intersection region, the intersection region CN2 is an example of a second intersection region, the through hole H11 is an example of a first through hole, and the through hole H12 is an example of a second through hole.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A printed circuit board comprising:
   an insulating layer;
   first and second wiring patterns that are formed on one surface of said insulating layer and constitute a signal line pair;
   first and second electrode pads that are formed on one surface of said insulating layer and are connected to said first wiring pattern;
   third and fourth electrode pads that are formed on one surface of said insulating layer and are connected to said second wiring pattern;
   a first connecting layer that is provided on the other surface of said insulating layer, wherein
   said first wiring pattern has first, second, third and fourth lines,
   said second wiring pattern has fifth, sixth, seventh and eighth lines,
   one ends of said first and second lines are electrically connected to each other and the other ends of said first and second lines are electrically connected to each other,
   said third line extends to be branched from the one end of said first line or the one end of said second line and is connected to said first electrode pad,
   said fourth line extends to be branched from the other end of said first line or the other end of said second line and is connected to said second electrode pad,
   one ends of said fifth and sixth lines are electrically connected to each other and the other ends of said fifth and sixth lines are electrically connected to each other,
   said seventh line extends to be branched from the one end of said fifth line or the one end of said sixth line and is connected to said third electrode pad,
   said eighth line extends to be branched from the other end of said fifth line or the other end of said sixth line and is connected to said fourth electrode pad,
   said first and second lines of said first wiring pattern and said fifth and sixth lines of said second wiring pattern are arranged such that any one of said first and second lines is located between said fifth and sixth lines and any one of said fifth and sixth lines is located between said first and second lines,
   a first intersection region in which said first or second line of said first wiring pattern and said fifth or sixth line of said second wiring pattern intersect with each other is provided,
   a second intersection region in which said first or second line of said first wiring pattern and said fifth or sixth line of said second wiring pattern intersect with each other is provided,
   a portion of said first or second line of said first wiring pattern positioned in said first intersection region is divided, a portion of said fifth or sixth line of said second wiring pattern positioned in said first intersection region is arranged on said insulating layer to pass through a portion in between divided portions of said first or second line of the first wiring pattern, said insulating layer has first and second through holes in said first intersection region, one of said divided portions of said first or second line of the first wiring pattern is electrically connected to said first connecting layer through said first through hole, and the other of said divided portions of said first or second line of the first wiring pattern is electrically connected to said first connecting layer through said second through hole.

2. The printed circuit board according to claim 1, further comprising a metal layer formed on the other surface of said insulating layer, wherein said first connecting layer is composed of part of said metal layer and is electrically separated from other portions of said metal layer.

3. The printed circuit board according to claim 1, further comprising a second connecting layer provided on the other surface of said insulating layer, wherein a portion of said fifth or sixth line of said second wiring pattern positioned in said second intersection region is divided, a portion of said first or second line of said first wiring pattern positioned in said second intersection region is arranged on said insulating layer to pass through a portion in between divided portions of said fifth or sixth line of said second wiring pattern, said insulating layer has third and fourth through holes in said second intersection region, one of said divided portions of said fifth or sixth line of said second wiring pattern is electrically connected to said second connecting layer through said third through hole, and the other of said divided portions of said fifth or sixth line of said second wiring pattern is electrically connected to said second connecting layer through said fourth through hole.

4. The printed circuit board according to claim 3, further comprising a metal layer formed on the other surface of said insulating layer, wherein said first connecting layer is composed of part of said metal layer and is electrically separated from other portions of said metal layer, and said second connecting layer is composed of another part of said metal layer and is electrically separated from other portions of said metal layer.

5. The printed circuit board according to claim 1, further comprising:

a width of each of said third line and said fourth line is obtained by adding a width of said first line and a width of said second line, and a width of each of said seventh line and said eighth line is obtained by adding a width of said fifth line and a width of said sixth line.

6. A method of manufacturing a printed circuit board, comprising the steps of:

forming first and second wiring patterns constituting a signal line pair and first, second, third and fourth electrode pads on one surface of an insulating layer; and forming a connecting layer on the other surface of said insulating layer, wherein the step of forming said first and second wiring patterns and said first, second, third and fourth electrode pads includes the steps of forming first and second through holes in said insulating layer in a first intersection region, and forming said first and second wiring patterns and said first, second, third and fourth electrode pads on said insulating layer such that said first wiring pattern is composed of first, second, third and fourth lines and said second wiring pattern is composed of fifth, sixth, seventh and eighth lines, said first and second lines of said first wiring pattern and said fifth and sixth lines of said second wiring pattern are arranged such that any one of said first and second lines is located between said fifth and sixth lines and any one of said fifth and sixth lines is located between said first and second lines, said first or second line of said first wiring pattern and said fifth or sixth line of said second wiring pattern intersect with each other in the first intersection region and said first or second line of said first wiring pattern and said fifth or sixth line of said second wiring pattern intersect with each other in a second intersection region, one ends of said first and second lines are electrically connected to each other, the other ends of said first and second lines are electrically connected to each other, said third line extends to be branched from the one end of said first line or the one end of said second line and is connected to said first electrode pad, said fourth line extends to be branched form the other end of said first line or the other end of said second line and is connected to said second electrode pad, one ends of said fifth and sixth lines are electrically connected to each other, the other ends of said fifth and sixth lines are electrically connected to each other, said seventh line extends to be branched from the one end of said fifth line or the one end of said sixth line and is connected to said third electrode pad, said eighth line extends to be branched from the other end of said fifth line or the other end of said sixth line and is connected to said fourth electrode pad, a portion of said first or second line of said first wiring pattern positioned in said first intersection region is divided, a portion of said fifth or sixth line of said second wiring pattern positioned in said first intersection region passes through a portion in between divided portions of said first or second line of said first wiring pattern on said insulating layer, one of said divided portions of said first or second line of said first wiring pattern is electrically connected to said connecting layer through said first through hole, and the other of said divided portions of said first or second line of said first wiring pattern is electrically connected to said connecting layer through said second through hole.

* * * * *